United States Patent [19]
Wehbi

[11] Patent Number: 5,831,486
[45] Date of Patent: Nov. 3, 1998

[54] EXTENDED RANGE CURRENT CONTROLLED OSCILLATOR

[75] Inventor: Ali Wehbi, Santa Clara, Calif.

[73] Assignee: Integrated Device Technology, Inc., Santa Clara, Calif.

[21] Appl. No.: 923,263

[22] Filed: Sep. 4, 1997

[51] Int. Cl.$^6$ .................................................. H03B 1/00
[52] U.S. Cl. ........................................ 331/57; 331/177 R
[58] Field of Search .................................... 331/57, 177 R

[56] References Cited

U.S. PATENT DOCUMENTS

| | | | |
|---|---|---|---|
| 5,302,919 | 4/1994 | Abe | 331/57 |
| 5,680,038 | 10/1997 | Fiedler | 323/315 |

OTHER PUBLICATIONS

J. Babanezhad and R. Gregorian, "A Programmable Gain/Loss Circuit", IEEE Journal of Solid–State Circuits, vol. SC–22, No. 6, Dec. 1987, pp. 1082–1090.

H. Meyr and G. Ascheid, "Phased–Locked Loop Fundamentals", Synchronization in Digital Communications, 1990, pp. 21–97, John Wiley & Sons, New York.

*Primary Examiner*—Siegfried H. Grimm
*Attorney, Agent, or Firm*—Pillsbury,Madison & Sutro, LLP

[57] ABSTRACT

An oscillator circuit includes biasing branches in the input section for permitting the oscillator gain and center frequency to be easily adjusted depending on design requirements. Accordingly, the oscillator circuit can be designed so as to have a lower overall gain and bandwidth yet operative at desired high frequencies. An output section includes a high-swing cascode current mirror for rejecting noise perturbations on the power supply so that they do not enter the oscillator stage, thus reducing jitter in the PLL frequency. The output section can be biased by a current mirror section so as to feed back an output voltage to one of the biasing branches of the input section, further lowering the overall gain and bandwidth of the oscillator circuit.

15 Claims, 8 Drawing Sheets

EXTENDED RANGE CURRENT CONTROLLED OSCILLATOR

BACKGROUND OF THE INVENTION

1. Field of the Invention

The present invention relates to oscillator circuits, and more particularly, to current controlled oscillator circuits having a substantially linear gain over an extended range of input control values.

2. Description of the Related Art

Figure 1:
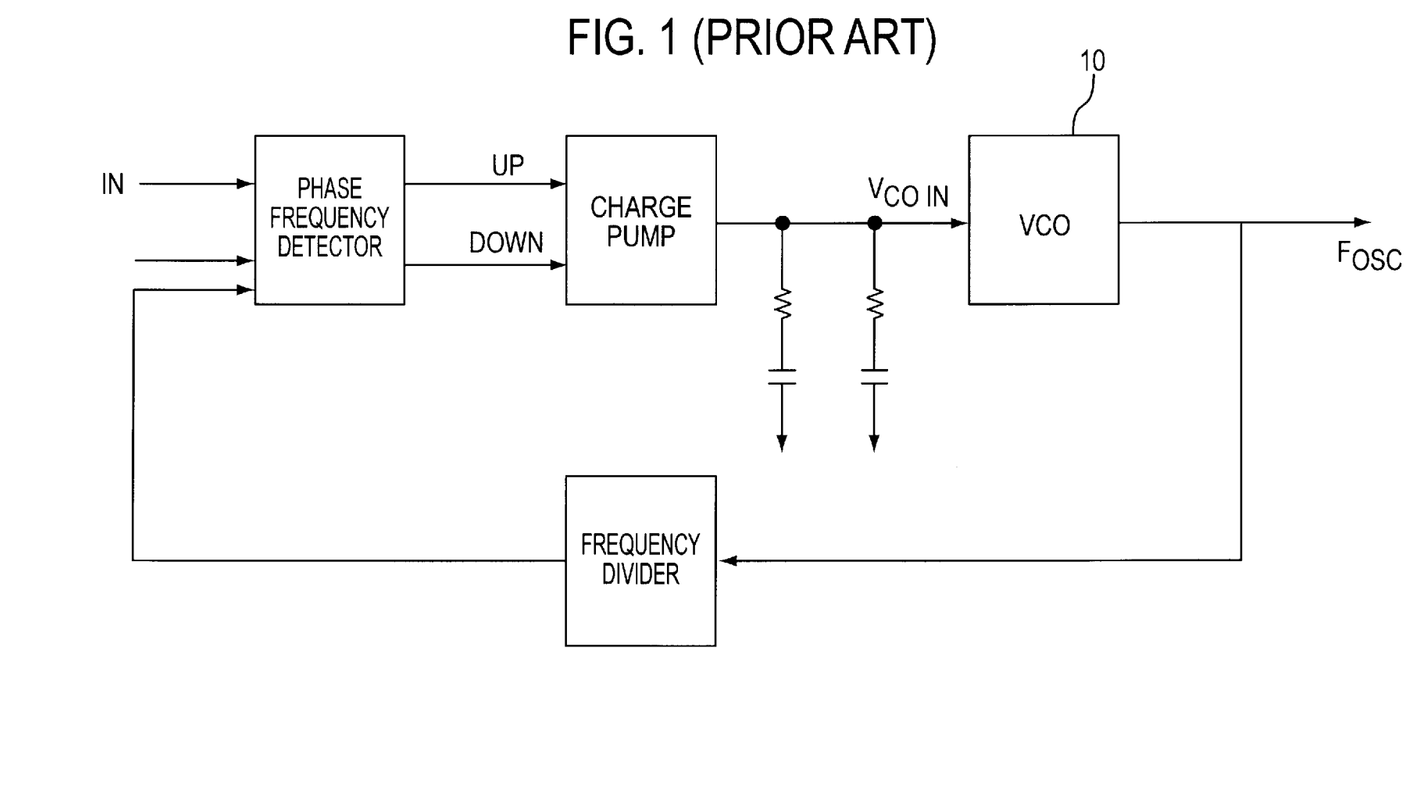
FIG. 1 is a block diagram of a conventional phase-locked-loop.

Phase-locked-loops (PLLs) have many applications, such as in frequency synthesizers and clock generators. A conventional phase-locked-loop (PLL) is shown in FIG. 1. The component of the PLL which is the subject of this invention is the voltage-controlled oscillator (VCO) stage 10.

One of the important design parameters in the PLL is the gain $K_v$ of the voltage controlled oscillator stage. Ideally, the gain, measured in oscillator frequency per volt, has a linear characteristic over an input control range extending from reference ground to the supply voltage. Typical plots of oscillator frequency as a function of input voltage appear in FIGS. 2a and 2b.

Figure 2A:
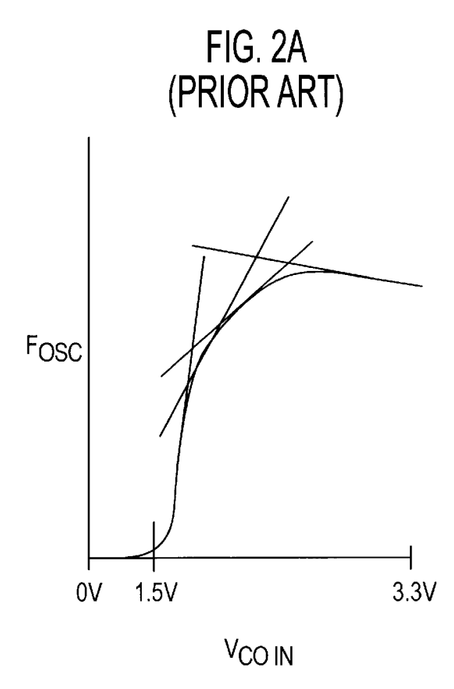
FIGS. 2a–2c illustrate the input voltage versus output frequency for a poorly designed conventional VCO, a state-of-the-art conventional VCO, and a VCO constructed according to the principles of the invention, respectively.

In a poorly designed VCO, whose characteristics are shown in FIG. 2a, there is considerable variation in slope with the slope becoming negative at the maximum control voltage. Such a VCO would cause the PLL to become unstable.

Figure 3:
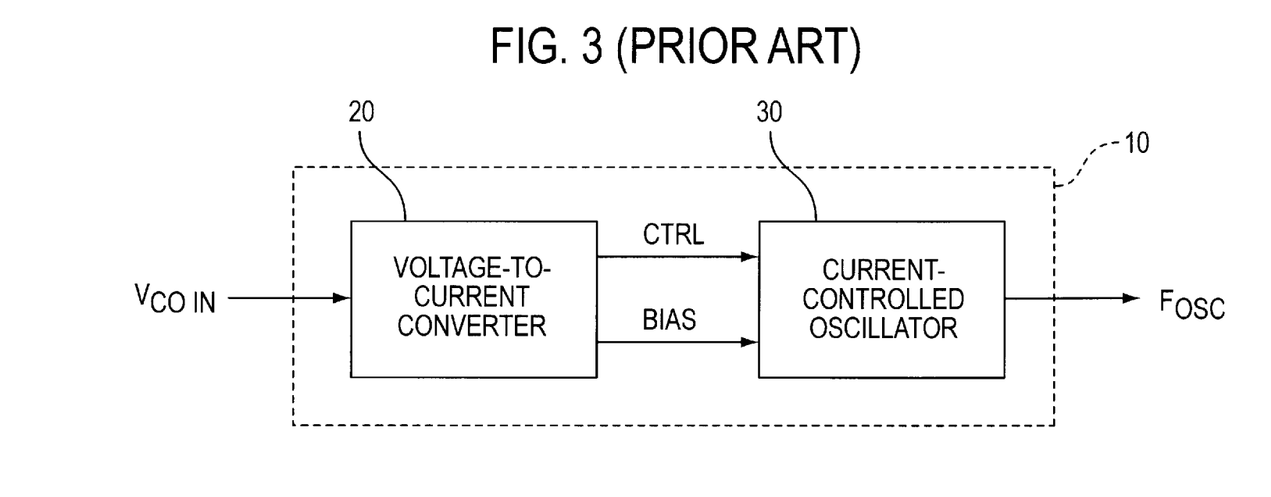
FIG. 3 is a block diagram of a VCO constructed in two stages consisting of a voltage to current converter and a current controlled oscillator.
Figure 4:
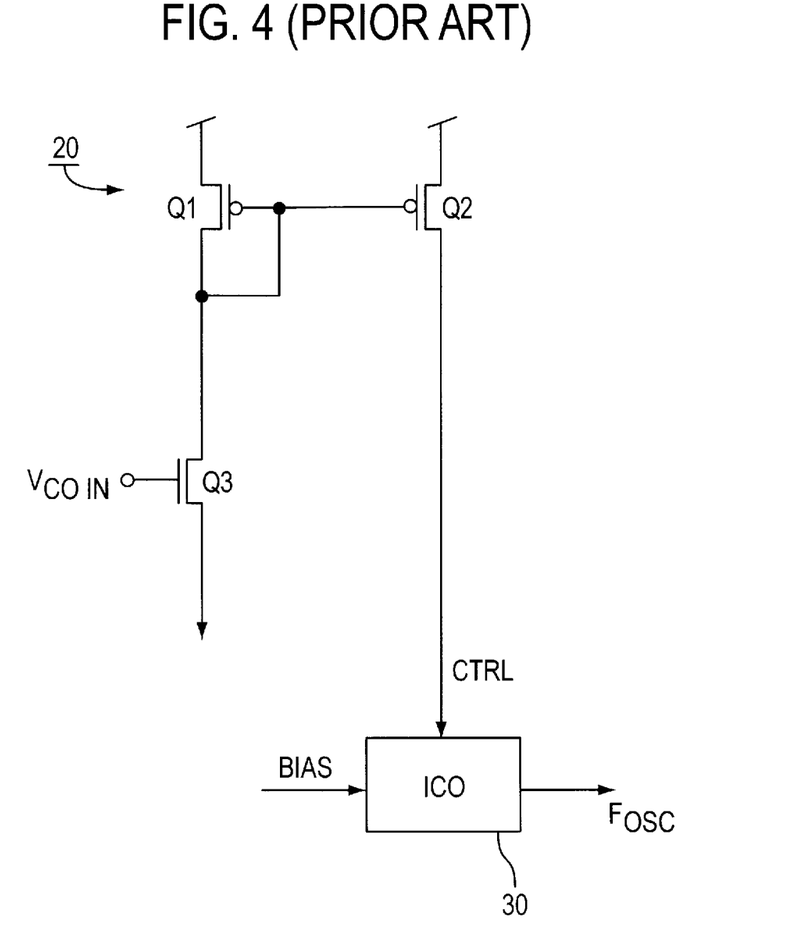
FIG. 4 is a circuit diagram illustrating a state-of-the-art conventional oscillator circuit.

A state-of-the art VCO circuit, having the overall configuration of FIG. 3, is shown in FIG. 4. It aims at providing a more linear gain characteristic than that exhibited by poorly designed VCO circuits.

This VCO circuit is implemented in two stages, as shown in FIG. 3: a voltage to current converter (VI) stage 20, and a current controlled oscillator (ICO) stage 30. The VI stage 20 receives the control voltage $Vco_{in}$. The ICO stage 30 has two inputs: one input, CTRL, is a regulated supply voltage, and a second input is a bias. Current controlled oscillators (ICOs) of this type are well known in the art and a detailed description thereof is omitted here.

The VI stage of the state-of-the art VCO circuit includes two PMOS transistors Q1 and Q2 and an NMOS transistor Q3 connected to the source of transistor Q1. The gates of transistors Q1 and Q2 are connected to each other and to the source of transistor Q1. The input control voltage $Vco_{in}$ is applied to the gate of transistor Q3 and the source of transistor Q2 is connected to the input control terminal CTRL of the current controlled oscillator.

In operation, as the input control voltage $Vco_{in}$ increases, Q3 conducts more and pulls the source of transistor Q1 toward ground. Transistor Q1 is configured as a diode with its gate connected to its source. Accordingly, both transistors Q1 and Q2 are caused to conduct (equally, assuming their W/L ratios are matched). This causes more current to flow through the sources of transistors Q1 and Q2, and thus into the current controlled oscillator, thereby controlling the oscillator frequency.

Figure 2B:
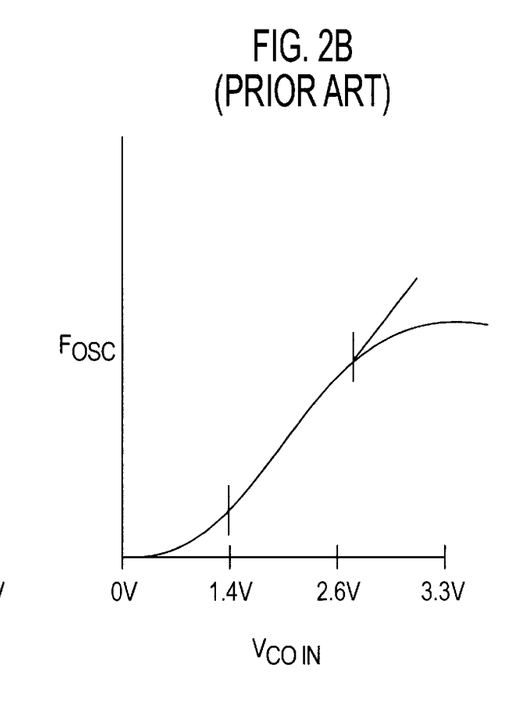

The state-of-the-art VCO shown in FIG. 4 improves upon the poorly designed VCO by providing a limited linear range where the gain is constant, as shown in FIG. 2b. However, some disadvantages remain. In particular, it cannot be designed for simultaneously providing lower overall gain $K_v$ and higher output frequencies. For example, if a center frequency (that is, the center of the range of output frequencies provided) of about 200 MHz is desired, the gain must be about 120 MHz/V (in a 3.3 volt application). Accordingly, such a circuit is undesirable for low-bandwidth high frequency applications where the gain must be less than 50 MHz/V. Moreover, it cannot prevent noise perturbations on the power supply from entering the oscillator stage. Such perturbations may lead to unstable VI stage operation, and possible jitter in the PLL frequency.

Although bandgap circuitry could be added to reduce the gain and bandwidth, such circuitry is difficult to implement in CMOS.

SUMMARY OF THE INVENTION

An object of the invention is to provide a current controlled oscillator in which the gain of the VCO can be controlled by the voltage to current converter both in magnitude and in center frequency.

Another object of the invention is to provide a current controlled oscillator having a voltage to current converter with high power supply rejection such that noise perturbations do not reflect into the oscillator circuit producing unwanted jitter in the PLL frequency.

Another object of the invention is to provide a current controlled oscillator that can provide linear gain over substantially an entire range of input control values.

Another object of the invention is to provide a current controlled oscillator in which the gain of the VCO can be controlled both in magnitude and in center frequency, and which can be easily implemented in CMOS.

To achieve these and other objects, the current controlled oscillator of the present invention provides biasing branches in the input section for permitting the oscillator gain and center frequency to be easily set depending on design requirements. Accordingly, an oscillator circuit can be designed that has a lower overall gain and bandwidth yet reaches desired high frequencies. An output section includes a high-swing cascode current mirror for rejecting noise perturbations on the power supply so that they do not enter the oscillator stage, thus reducing jitter in the PLL frequency. The output section can be biased so as to feed back an output voltage to one of the biasing branches of the input section, further reducing the overall gain and bandwidth of the oscillator circuit.

BRIEF DESCRIPTION OF THE DRAWINGS

The structural and functional aspects of the present invention will become readily understood by those skilled in the art by reference to the following detailed description, read in conjunction with the attached drawings, in which.

DETAILED DESCRIPTION OF THE PREFERRED EMBODIMENTS

Figure 5:
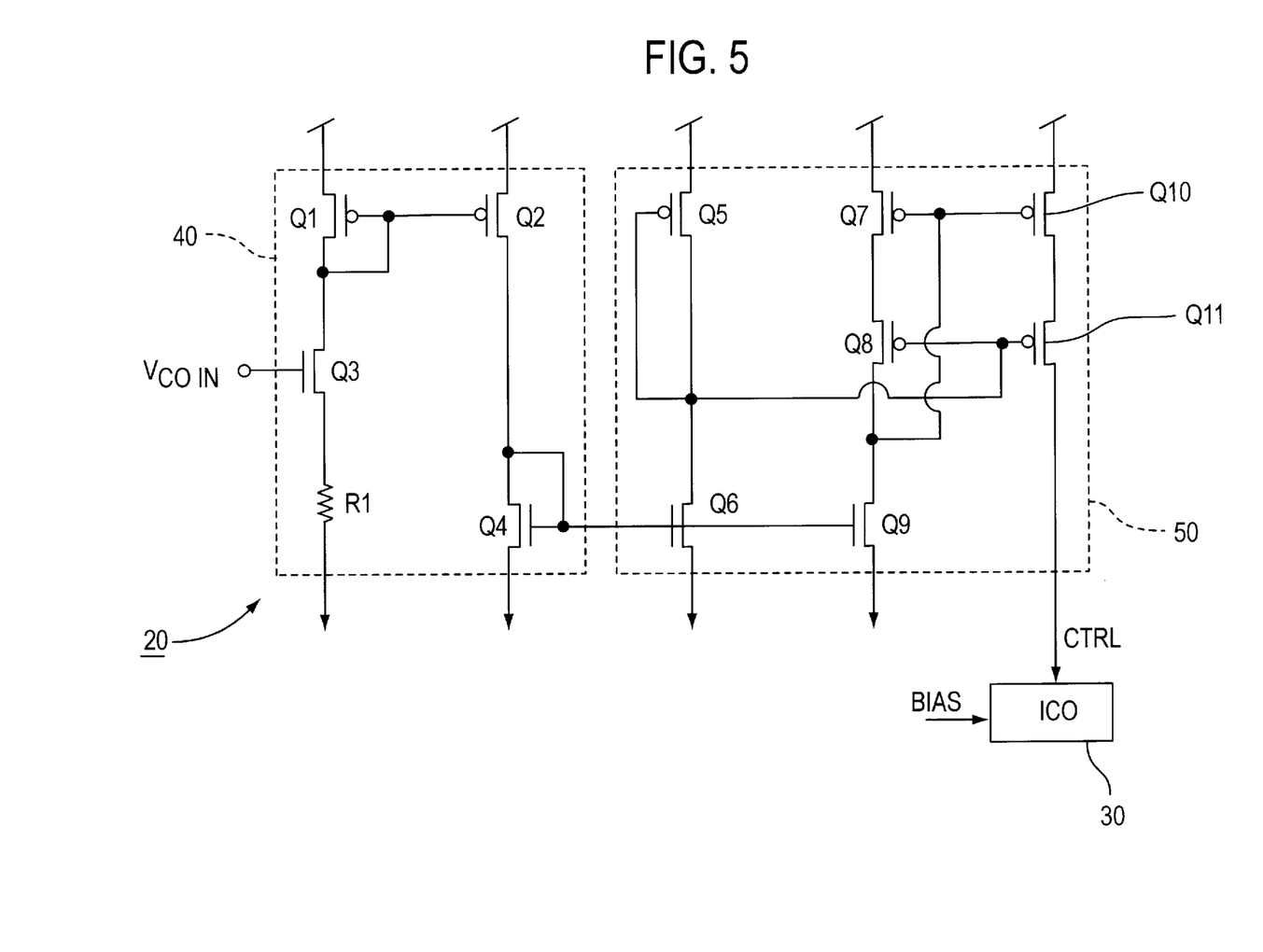
FIG. 5 is a circuit diagram illustrating an oscillator circuit which introduces high gain.

A voltage controlled oscillator having a voltage to current converter circuit in accordance with this invention is shown in FIG. 5.

The voltage to current converter circuit has an input section 40, having similar components provided in the conventional oscillator circuit illustrated in FIG. 4, but further including transistor Q4. In addition, the voltage to current converter stage has an output section 50 comprised of PMOS transistors Q5, Q7, Q8, Q10 and Q11, and NMOS transistors Q6 and Q9. The output section 50 prevents perturbations occurring on the power supply Vcc from entering the oscillator stage, thereby reducing unwanted jitter in the PLL frequency. It can be configured as a high-swing cascode current mirror such as that described in an article by Joseph N. Babanezhad and Roubik Gregorian entitled "A Programmable Gain/Loss Circuit," IEEE Journal of Solid-State Circuits, Vol. SC-22, No. 6 (1987).

In the output section, a first transistor pair Q7 and Q10 have their gates connected to each other and their drains connected to the power supply. A second transistor pair Q8 and Q11 have their gates connected to each other and their drains connected to the sources of transistors Q7 and Q10, respectively.

Transistor Q5 has its drain connected to the power supply and its gate and source connected to the gates of transistors Q8 and Q11. The gates of transistors Q7 and Q10 are further connected to the source of transistor Q8.

A three-way connection of transistors Q4, Q6 and Q9 controls the current in the output section according to the current flowing in the input section, which is, in turn, controlled by the input control voltage $Vco_{in}$, as described above with reference to FIG. 4. Transistor Q4 has its source and gate connected to the source of transistor Q2 and its drain connected to ground.

The gate of transistor Q6 is connected to the gate and source of transistor Q4, its source is connected to the source of transistor Q5, and its drain is connected to ground.

The amount of current conducted in transistor Q6 is controlled in accordance with the conduction of transistor Q4. That is, as $Vco_{in}$ increases, transistor Q3 pulls the source of transistor Q1 toward ground so that both transistors Q1 and Q2 are caused to conduct, in turn pulling the source of transistor Q2 towards the power supply voltage. This voltage is applied both to the gate and source of transistor Q4, as well as to the gates of transistors Q6 and Q9. The more transistor Q6 is caused to conduct, the more its source terminal is pulled toward ground, thus biasing the second transistor pair Q8 and Q11.

The gate of transistor Q9 is connected to the gate and source of transistor Q4, its source is connected to the source of transistor Q8, and its drain is connected to ground.

The amount of current conducted in transistor Q9 is likewise controlled in accordance with the conduction of transistor Q4. The more transistor Q9 is caused to conduct, the more its source terminal is pulled toward ground, thus biasing the first transistor pair Q7 and Q10.

As is apparent from the foregoing, the amount of current reflected from the input section through transistor Q11, and thus to ICO stage 30, is controlled by the biasing transistors Q6 and Q9, which bias the second and first transistor pairs, respectively.

The current flowing through the high-swing cascode current mirror, comprised of transistor pairs Q7, Q10, and Q8, Q11, and biasing transistors Q6 and Q9, is a stable current, substantially protected from noise perturbations on the power supply. The oscillation frequency in the PLL, being controlled by the current reflected into ICO stage 30, is thus substantially free of jitter.

Moreover, in comparison with the state-of-the-art oscillator circuit, resistor R1 can be added to the input section 40 and connected between the source of transistor Q3 and ground so as to provide further controllability of the current generated in the input section 40 in response to the input control voltage $Vco_{in}$. That is, the size of resistor R1 can be adjusted so as to control the bias point of transistor Q1, configured as a diode with its source and gate connected together, and thus controls the slope $K_v$ of the gain curve of oscillator frequency versus input control voltage. Accordingly, high gain can be achieved with this oscillator circuit.

The control current (CTRL) to ICO stage 30 is fed from the source of transistor Q11 of output section 50, and a bias is supplied to ICO stage 30's bias input.

Figure 6:
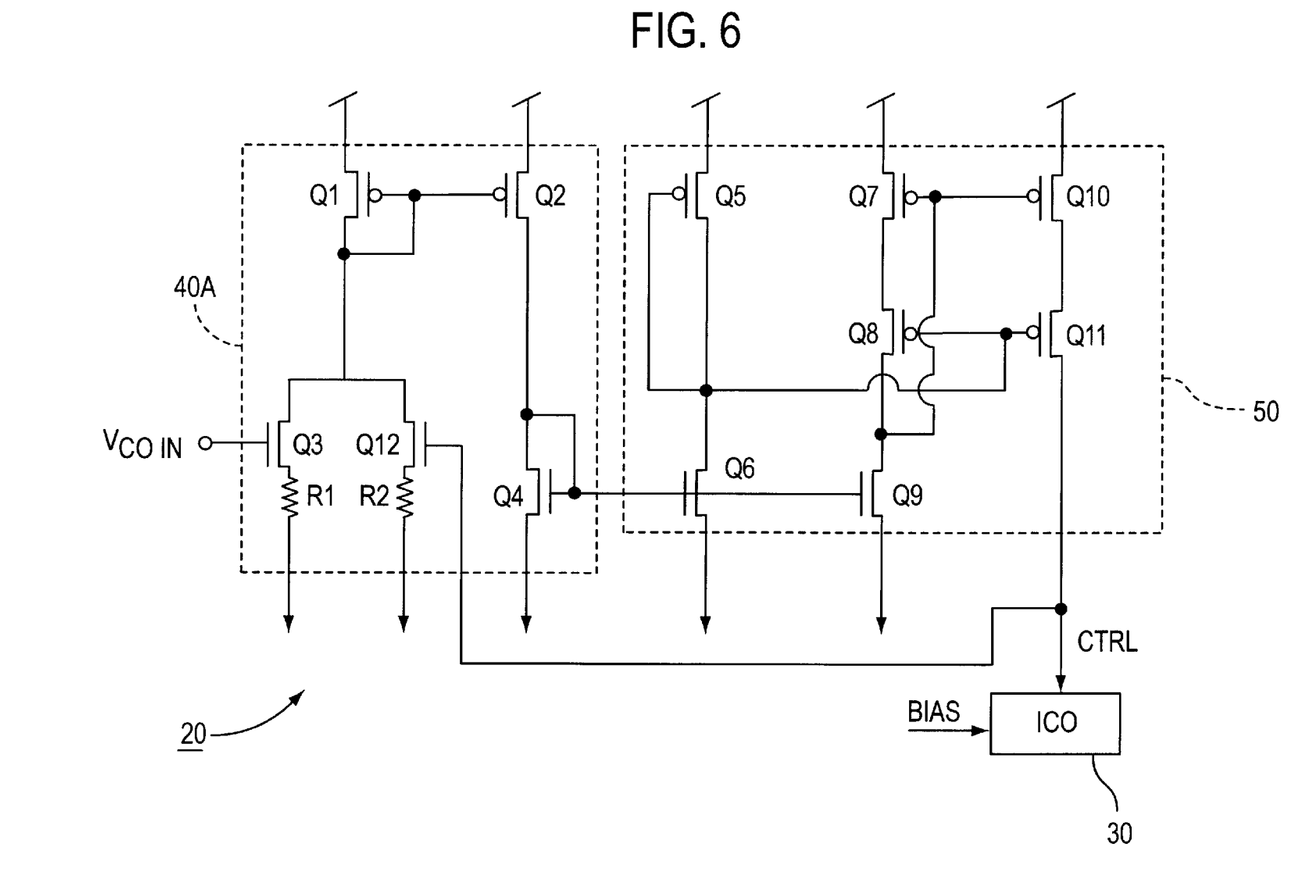
FIG. 6 is a circuit diagram illustrating an oscillator circuit which introduces feedback to an input stage biasing branch.

Another voltage controlled oscillator having a voltage to current converter circuit in accordance with the invention is shown in FIG. 6.

The circuit of FIG. 6 differs from the circuit of FIG. 5 primarily by connecting a second biasing branch in the input section 40A, comprised of NMOS transistor Q12 and resistor R2, in parallel with the first biasing branch comprised of transistor Q3 and resistor R1. The gate of transistor Q12 is connected to the source of transistor Q11 in output section 50.

By feeding back the voltage from output section 50 to the input section transistor Q12, and by adjusting the sizes of transistor Q12 and R2 so that the current in the second biasing branch is much larger than the current in the first biasing branch, the combined gain of the VI-ICO implemented VCO can be lowered considerably. This is because as transistors Q10 and Q11 conduct so as to mirror the current flowing in the input section, the voltage at the output node of the output section is pulled toward the power supply voltage. This causes transistor Q12 to conduct more fully, causing the second biasing branch to draw more current. This in turn reduces the responsivity of the input section to increases in the input control voltage $Vco_{in}$, and hence lowers the overall gain of the oscillator circuit.

Moreover, the output section 50 can be biased so that the voltage of the CTRL output at the source of transistor Q11, and fed back to transistor Q12 in input section 40B, is a regulated nonzero value that keeps transistor Q12 in conduction even when the input control voltage $Vco_{in}$ is zero, thereby reducing the overall bandwidth of the oscillator circuit. That is, because the voltage to current converter circuit 20 is essentially "free-running," the range of output frequencies from ICO stage 30, that is, the overall bandwidth, can be lowered by increasing the minimum output frequency while keeping the gain low.

Accordingly, the desired center frequency of the VCO can be set in the second biasing branch by adjusting the sizes of transistor Q12 and resistor R2, and in accordance with the bias point of bias diode Q1. The slope $K_v$ of the oscillator frequency versus input voltage, $Vco_{in}$, is also largely set by these values, but can be further controlled by the size of the input transistor Q3 and resistor R1 in the first biasing branch.

Figure 2C:
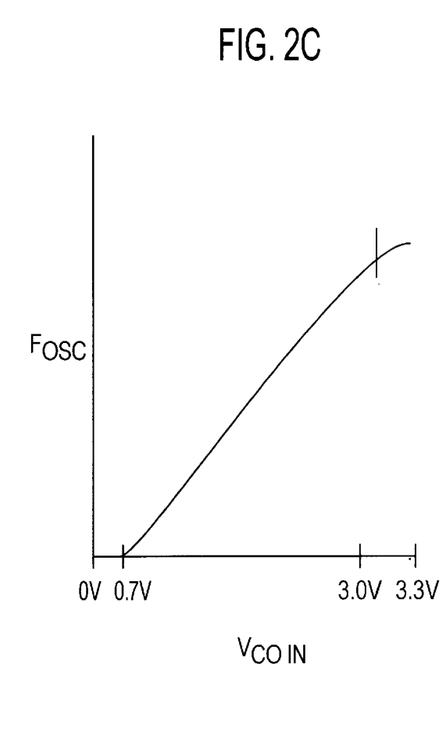

The VCO constructed as above has the gain characteristics shown in FIG. 2c. As can be seen, it has an expanded linear range extending from 0.7 volts to 3.0 volts for a 3.3 volt power supply. A similar extended range can be obtained with a 5 volt supply.

Table 1 below compares the results obtained with various values of Q12 and R2 with an input control voltage $Vco_{in}$ of 1.7 volts and a power supply voltage of 3.3 volts.

TABLE 1

| Transistor Q12 | Resistor R2 | $I_{Q11}$ (mA) | $F_{OSC}$ (MHz) | $V_{CTRL}$ (V) | $K_v$ (MHz/V) |
|---|---|---|---|---|---|
| (A) W/L = 160/1.5 | 2 k-Ohm | 1.10 | 120 | 1.5 | 36 |
| (B) W/L = 160/1.5 | 1 k-Ohm | 3.4 | 280 | 2.1 | 24 |
| (C) W/L = 80/1 | 1 k-Ohm | 3.25 | 275 | 2.0 | 31 |
| (D) W/L = 80/1 | 2 k-Ohm | 1.2 | 123 | 1.55 | 35 |

As is apparent from the foregoing table, to keep $K_v$ less than 50 MHz/V, and to reach higher oscillator frequencies on the order of 200 MHz, the sizes of transistor Q12 and resistor R2 can be adjusted depending on the particular design requirements. The gain can also be adjusted by resizing the components Q3 and R1, but this will have a smaller effect than that provided by resizing Q12 and R2 in this example.

Figure 7:
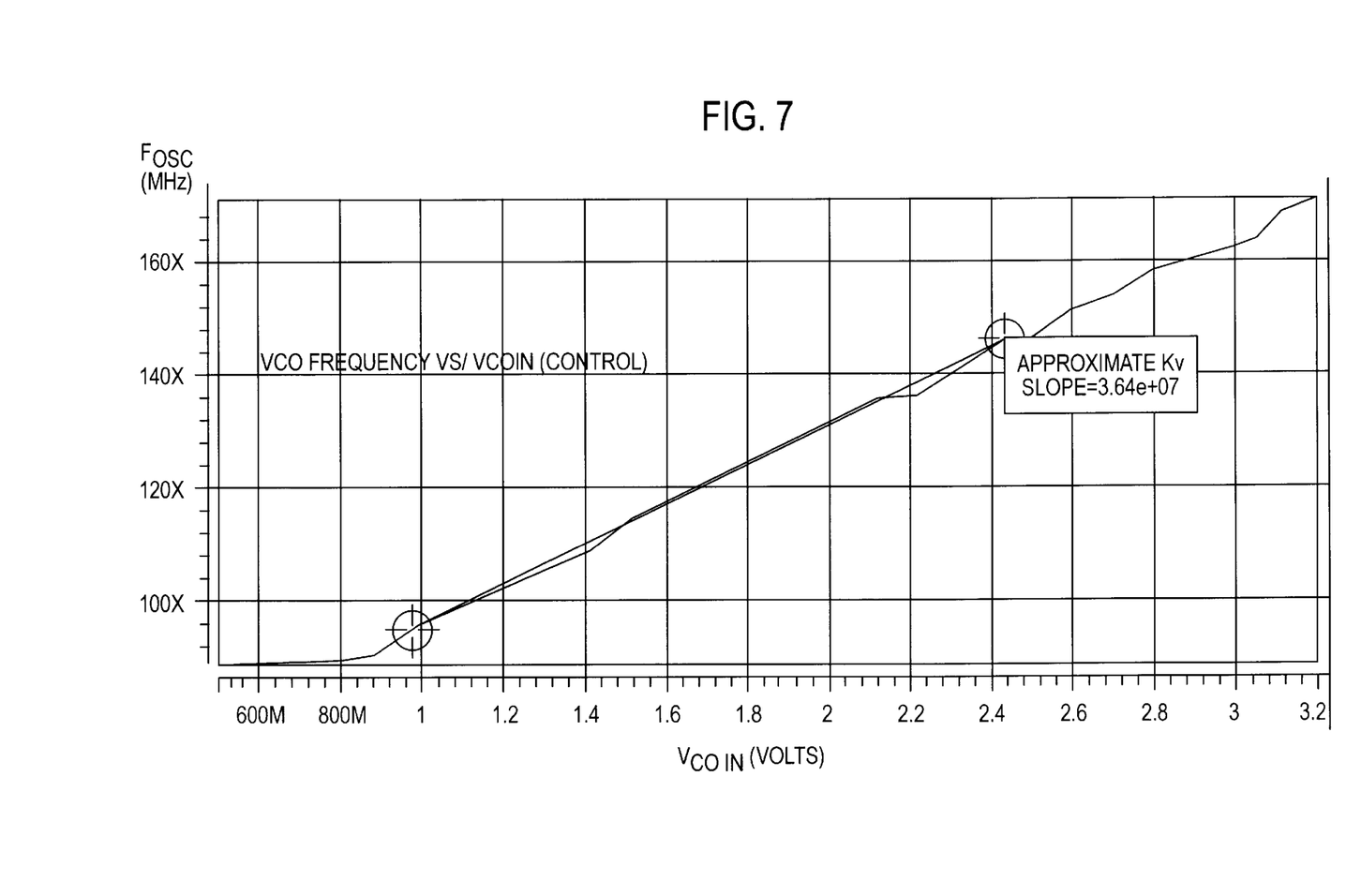
FIG. 7 illustrates the input voltage versus output frequency characteristic for a VCO constructed according to the principles of the present invention and having the component values of configuration (A) as illustrated in Table 1.

FIG. 7 illustrates the experimental results of oscillator frequency versus input control voltage by constructing an oscillator circuit having the component values represented in case (A) of Table 1.

Figure 8:
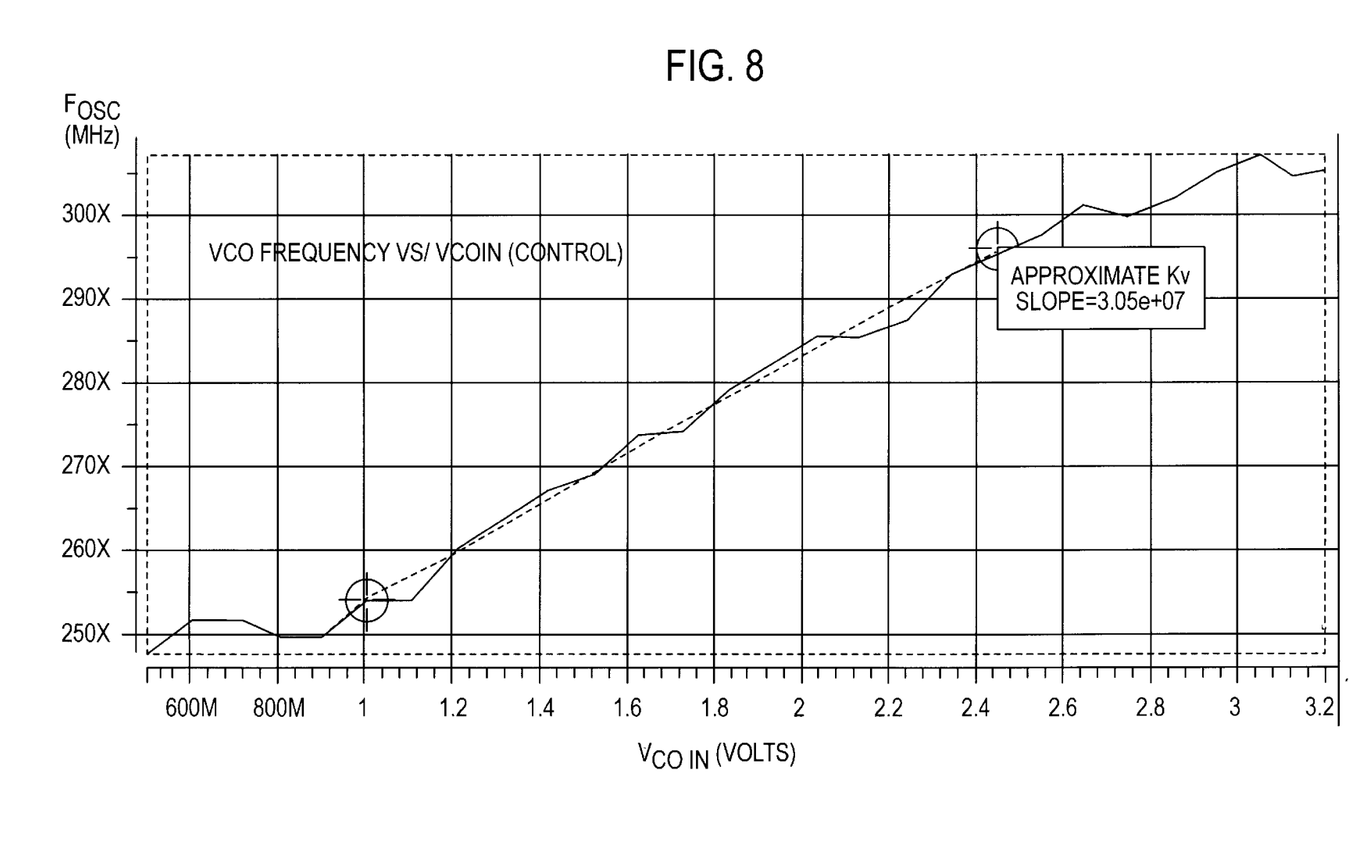
FIG. 8 illustrates the input voltage versus output frequency characteristic for a VCO constructed according to the principles of the present invention and having the component values of configuration (C) as illustrated in Table 1.

FIG. 8 illustrates the experimental results of oscillator frequency versus input control voltage by constructing an oscillator circuit having the component values represented in case (C) of Table 1.

It should be noted that the bias input to the ICO stage 30 can be supplied from an external circuit, such as a bandgap circuit, or it can be supplied internally, for example, by adding an additional current mirror stage between the input section 40 and output section 50. Such an internal current mirror stage could be comprised, for example, in a circuit such as that illustrated in FIG. 6, by a PMOS transistor with its drain coupled to the power supply and its gate coupled to the source of transistor Q1, and an NMOS transistor having its gate and drain connected together and both coupled to the source of the PMOS transistor, and its source coupled to ground. In this case, the bias could be supplied from a node between the conduction paths of the NMOS and PMOS transistors.

Although the present invention has been described with reference to the preferred embodiments, it should be noted that these descriptions are provided so as to teach the inventive concepts, as well as the best modes for practicing those inventive concepts, to those skilled in the art. Accordingly, those skilled in the art will readily understand that modifications of and substitutions within these illustrative examples are possible while remaining within the spirit and scope of the invention as set forth in the appended claims.

I claim:

1. An oscillator circuit powered by a power supply comprising:
   a current controlled oscillator stage; and
   a voltage to current converter stage having:
      an input section that generates a current in response to a received input control voltage, and
      an output section that mirrors said current generated in said input section and supplies a reflected current to said current controlled oscillator stage, said output section substantially preventing noise perturbations on said power supply from influencing said reflected current.

2. An oscillator circuit as defined in claim 1, wherein said input section comprises:
   a diode;
   a first biasing branch connected between said diode and ground; and
   a second biasing branch connected between said diode and ground, in parallel with said first biasing branch, said first and second biasing branches setting a gain of oscillator frequency per voltage and a center frequency of said oscillator circuit.

3. An oscillator circuit as defined in claim 2, wherein said first biasing branch includes:
   a first resistor coupled to ground; and
   a first transistor coupled between said first resistor and said diode and controlled by said received input control voltage.

4. An oscillator circuit as defined in claim 2, wherein said second biasing branch includes:
   a second resistor coupled to ground; and
   a second transistor coupled between said second resistor and said diode and controlled by an output voltage that is fed back from said output section.

5. An oscillator circuit as defined in claim 4, wherein said output section includes a high-swing cascode current mirror.

6. An oscillator circuit as defined in claim 5, wherein said high-swing cascode current mirror includes:
   a first pair of transistors having their gates connected together at a first bias point;
   a second pair of transistors having their gates connected together at a second bias point, said first transistor pair being coupled between said second transistor pair and said power supply;
   a first bias transistor coupled between ground and said first bias point; and
   a second bias transistor coupled between ground and said second bias point.

7. An oscillator circuit as defined in claim 6, wherein said first and second bias transistors are controlled by said current generated in said input section.

8. An oscillator circuit as defined in claim 7, wherein said output voltage and said reflected current are supplied by said second pair of transistors.

9. An oscillator circuit as defined in claim 8, wherein said first and second bias transistors bias said first and second transistor pairs such that said output voltage is nonzero when said received input control voltage is zero.

10. An oscillator circuit as defined in claim 2, wherein said oscillator circuit is implemented in a CMOS integrated circuit.

11. An oscillator circuit as defined in claim 10, wherein said gain is about 50 MHz per volt, and said center frequency is about 200 MHz when said power supply is about 3.3 volts.

12. An oscillator circuit as defined in claim 1, further comprising a current mirror stage that mirrors said current generated in said input section and supplies a bias to said current controlled oscillator stage in accordance therewith.

13. An oscillator circuit powered by a power supply and having an oscillator stage that has an output frequency controlled by a control current, said oscillator circuit comprising:
- a diode;
- a bias branch coupled to said diode that receives an input control voltage and biases said diode into conduction in accordance therewith;
- a first transistor pair having their gates connected at a first bias point and having their drains coupled to said power supply;
- a first bias transistor coupled to said diode that is controlled in accordance with said conduction of said diode, said first bias transistor setting the voltage of said first bias point;
- a second transistor pair having their gates connected at a second bias point and having their drains respectively coupled to the sources of said first transistor pair;
- a second bias transistor coupled to said diode that is controlled in accordance with said conduction of said diode, said second bias transistor setting the voltage of said second bias point, said first and second transistor pairs generating said control current in accordance with the voltages of said first and second bias points.

14. An oscillator circuit powered by a power supply and having an oscillator stage that has an output frequency controlled by a control current, said oscillator circuit comprising:
- a diode;
- a first bias branch coupled to said diode that receives an input control voltage and biases said diode into conduction in accordance therewith;
- a second bias branch coupled to said diode in parallel with said first bias branch that receives a feedback voltage and biases said diode into conduction in accordance therewith;
- a first transistor pair having their gates connected at a first bias point and having their drains coupled to said power supply;
- a first bias transistor coupled to said diode that is controlled in accordance with said conduction of said diode, said first bias transistor setting the voltage of said first bias point;
- a second transistor pair having their gates connected at a second bias point and having their drains respectively coupled to the sources of said first transistor pair;
- a second bias transistor coupled to said diode that is controlled in accordance with said conduction of said diode, said second bias transistor setting the voltage of said second bias point, said first and second transistor pairs generating said feedback voltage and said control current in accordance with the voltages of said first and second bias points.

15. An oscillator circuit powered by a power supply and having an oscillator stage that has an output frequency controlled by a control current and a bias, said oscillator circuit comprising:
- a diode;
- a first bias branch coupled to said diode that receives an input control voltage and biases said diode into conduction in accordance therewith;
- a second bias branch coupled to said diode in parallel with said first bias branch that receives a feedback voltage and biases said diode into conduction in accordance therewith;
- a first current mirror coupled to said diode that generates said bias in accordance with said conduction of said diode;
- a second current mirror coupled to said diode that sets a second current mirror bias in accordance with said conduction of said diode;
- a first transistor pair having their gates connected at a first bias point and having their drains coupled to said power supply;
- a first bias transistor coupled to said second current mirror that is controlled in accordance with said second current mirror bias, said first bias transistor setting the voltage of said first bias point;
- a second transistor pair having their gates connected at a second bias point and having their drains respectively coupled to the sources of said first transistor pair;
- a second bias transistor coupled to said second current mirror that is controlled in accordance with said second current mirror bias, said second bias transistor setting the voltage of said second bias point, said first and second transistor pairs generating said control current and said feedback voltage in accordance with the voltages of said first and second bias points.

* * * * *